(12) United States Patent
Motz

(10) Patent No.: US 11,500,039 B2
(45) Date of Patent: Nov. 15, 2022

(54) DIGITALLY-CONTROLLED OUTPUT AMPLITUDE OF ANALOG SENSOR SIGNAL

(71) Applicant: Infineon Technologies AG, Neubiberg (DE)

(72) Inventor: Mario Motz, Wernberg (AT)

(73) Assignee: Infineon Technologies AG, Neubiberg (DE)

( * ) Notice: Subject to any disclaimer, the term of this patent is extended or adjusted under 35 U.S.C. 154(b) by 478 days.

(21) Appl. No.: 15/261,288

(22) Filed: Sep. 9, 2016

(65) Prior Publication Data

US 2017/0102438 A1   Apr. 13, 2017

(30) Foreign Application Priority Data

Oct. 7, 2015   (DE) .......................... 102015117109.0

(51) Int. Cl.
| | | |
|---|---|---|
| *G01R 33/00* | (2006.01) | |
| *G01R 33/07* | (2006.01) | |
| *H03F 3/387* | (2006.01) | |
| *H03F 3/45* | (2006.01) | |
| *H03G 3/30* | (2006.01) | |

(52) U.S. Cl.
CPC ....... *G01R 33/0029* (2013.01); *G01R 33/075* (2013.01); *H03F 3/387* (2013.01); *H03F 3/45475* (2013.01); *H03G 3/3089* (2013.01); *H03F 2200/261* (2013.01)

(58) Field of Classification Search
CPC ............ G01R 33/0029; G01R 33/0035; G01R 33/07; G01R 33/075; G01R 33/09; G01R 33/091; G01R 33/093; G01R 33/095; G01R 33/096; G01R 33/098; H03F 3/45475; H03F 3/387; H03F 2200/261; H03G 3/3089; G01B 7/14; G01B 7/30; G01D 5/142; G01D 5/145; G01D 5/147
See application file for complete search history.

(56) References Cited

U.S. PATENT DOCUMENTS

| | | | | |
|---|---|---|---|---|
| H965 H | | 9/1991 | Davis et al. | |
| 6,154,027 A | * | 11/2000 | Alexander | ............. G01R 33/07 323/368 |
| 8,350,563 B2 | | 1/2013 | Haas et al. | |
| 2002/0121896 A1 | * | 9/2002 | Kato | ...................... G01N 27/82 324/232 |
| 2002/0175758 A1 | | 11/2002 | Cyrusian et al. | |
| 2008/0143327 A1 | * | 6/2008 | Voisine | .................. G01D 5/247 324/207.26 |
| 2009/0009164 A1 | * | 1/2009 | Utsuno | ................... G01R 33/07 324/251 |
| 2009/0212983 A1 | * | 8/2009 | Fukuzawa | ........... H03F 3/45475 341/142 |
| 2011/0074405 A1 | * | 3/2011 | Doogue | ............. G01R 33/0023 324/251 |

(Continued)

FOREIGN PATENT DOCUMENTS

DE          3409795 A1  *  9/1984   ............. G01R 33/07

*Primary Examiner* — David M Schindler
(74) *Attorney, Agent, or Firm* — Eschweiler & Potashnik, LLC

(57) ABSTRACT

A device includes an analog main signal path and a digital control circuit. The digital control circuit determines and provides a digital control signal to the analog main signal path to reduce a gain error of the analog main signal path.

16 Claims, 4 Drawing Sheets

(56) References Cited

U.S. PATENT DOCUMENTS

| | | | |
|---|---|---|---|
| 2011/0133723 A1* | 6/2011 | Forsyth | G01D 5/145 324/207.2 |
| 2012/0286872 A1* | 11/2012 | Rozgo | G01D 18/004 330/279 |
| 2013/0093416 A1* | 4/2013 | Haas | G01R 33/0029 324/225 |
| 2014/0043085 A1* | 2/2014 | Motz | G01R 33/0035 327/307 |
| 2014/0077873 A1* | 3/2014 | Motz | H03F 3/387 330/9 |
| 2014/0145714 A1* | 5/2014 | Okatake | G01R 33/07 324/225 |
| 2016/0377690 A1* | 12/2016 | Huber | G01R 33/0064 702/104 |
| 2018/0062595 A1* | 3/2018 | Osawa | H03F 3/72 |

* cited by examiner

DIGITALLY-CONTROLLED OUTPUT AMPLITUDE OF ANALOG SENSOR SIGNAL

CROSS REFERENCE TO RELATED APPLICATIONS

This application claims priority to German Application No. 102015117109.0, filed on Oct. 7, 2015, which is hereby incorporated herein by reference in its entirety.

FIELD

Various embodiments relate to a device and to a method. In particular, various embodiments relate to techniques of digitally controlling an output amplitude with which an analog sensor signal is output.

BACKGROUND

Many modern day electronic components utilize sensors to measure physical quantities and to convert the measured physical quantities into sensor signals that are output to an electronic instrument, e.g., an integrated chip processor. In hand held portable devices, e.g., cell phones, sensors are typically operated at a low power to enable long battery life. Similar considerations apply for automotive applications, etc.

One way to conserve power is to rely on sensors providing analog sensor signals having a small amplitude. Where required, the analog sensor signal may then be amplified. However, to accurately convey information using signals with a small amplitude, offset errors and gain errors should be kept low.

U.S. Pat. No. 8,350,563 B2 discloses a magnetic field sensor and a method associated with the magnetic field sensor providing gain correction coefficients and/or offset correction coefficients stored in the magnetic field sensor in digital form. The gain correction coefficients and/or offset correction coefficients can be used to generate analog control signals to control a sensitivity and/or an offset of an analog signal path through the magnetic field sensor.

However, such techniques face certain drawbacks and restrictions. Employing the analog control signals can induce additional errors. Further, employing the analog control signals can require additional circuitry in the form of digital-to-analog converters (DACs). Further, employing the offset correction coefficients can be inaccurate and subject to lifetime drifts.

SUMMARY

Therefore, a need exists for advanced techniques of amplifying and outputting analog sensor signals. In particular, a need exists for advanced techniques of reducing offset errors and/or gain errors when amplifying and outputting analog sensor signals.

This need is met by the features of the independent claims. The dependent claims defined embodiments.

According to an aspect, a device is provided. The device comprises an analog main signal path and a digital control circuit. The analog main signal path is configured to amplify and output an analog sensor signal of a sensor at a digitally-controllable output amplitude. The digital control circuit is coupled with the analog main signal path. The digital control circuit is configured to determine a digital control signal. The digital control circuit is further configured to provide the digital control signal to the analog main signal path to reduce a gain error of the analog main signal path. The analog main signal path is configured to set the digitally-controllable output amplitude depending on the digital control signal.

According to an aspect, a method is provided. The method comprises determining a digital control signal. The method further comprises setting a digitally-controllable output amplitude of an analog sensor signal depending on the digital control signal to reduce a gain error of amplifying and outputting the analog sensor signal. The method further comprises amplifying and outputting the analog sensor signal at the digitally-controllable output amplitude.

According to an aspect, a device is provided. The device comprises an analog main signal path and a digital control circuit. The analog main signal path is configured to amplify and output an analog sensor signal of a sensor at a digitally-controllable output amplitude. The digital control circuit is coupled with the analog main signal path. The digital control circuit is configured to determine a digital control signal. The digital control circuit is further configured to provide the digital control signal to the analog main signal path to implement a ratiometric behavior of the analog main signal path. The analog main signal path is configured to set the digitally-controllable output amplitude depending on the digital control signal.

According to an aspect, a method is provided. The method comprises determining a digital control signal. The method further comprises setting a digitally-controllable output amplitude of an analog sensor signal depending on the digital control signal to implement a ratiometric behavior of amplifying and outputting the analog sensor signal. The method further comprises amplifying and outputting the analog sensor signal at the digitally-controllable output amplitude.

It is to be understood that the features mentioned above and those yet to be explained below may be used not only in the respective combinations indicated, but also in other combinations or in isolation without departing from the scope of the invention.

BRIEF DESCRIPTION OF THE DRAWINGS

The foregoing and additional features and effects of the invention will become apparent from the following detailed description when read in conjunction with the accompanying drawings, in which like reference numerals refer to like elements.

DETAILED DESCRIPTION

Figure 1:
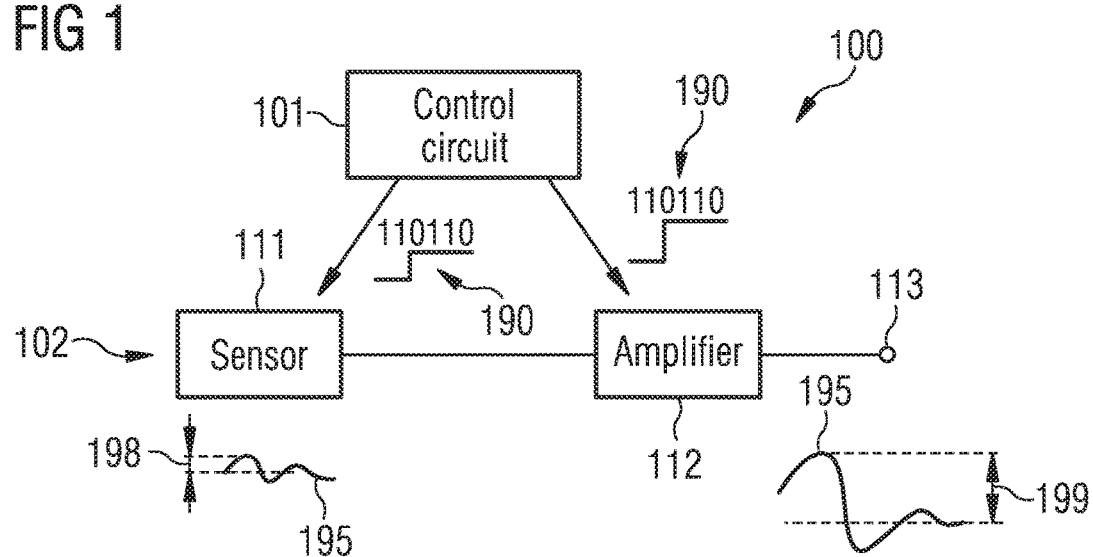
FIG. 1 schematically illustrates a device according to various embodiments, wherein the device comprises a digital control circuit and an analog main signal path comprising a sensor and an amplifier, wherein the digital control circuit is configured to provide a digital control signal to the analog main signal path to set a digitally-controllable output amplitude with which the analog main signal paths outputs an analog sensor signal of the sensor.

In the following, embodiments of the invention will be described in detail with reference to the accompanying drawings. It is to be understood that the following description of embodiments is not to be taken in a limiting sense. The scope of the invention is not intended to be limited by the embodiments described hereinafter or by the drawings, which are taken to be illustrative only.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Hereinafter, various techniques with respect to processing an analog sensor signal provided by a sensor will be explained. In particular, techniques of amplifying and outputting the analog sensor signal at a reduced gain error will be disclosed.

The gain error may be due to lifetime drifts and/or changing environmental conditions such as humidity, temperature, etc. The gain error may correspond to a multiplicative error of said amplifying and outputting of the analog sensor signal. E.g., the gain error may in some scenarios result from a deviation from ideal ratiometric behavior and may thus comprise a deviation from ratiometric behavior.

In some scenarios, it is possible to reduce an offset error. The offset error may correspond to an additive error of said amplifying and outputting of the analog sensor signal. The offset error may correspond to a DC offset in the analog sensor signal or an AC offset ripple signal caused by chopping. The offset error may be due to the sensor and/or said amplifying. The offset error may be due to lifetime drifts and/or changing environmental conditions. Further, at least some contributions to the offset error may be inherent for an operating principle of the sensor.

In certain scenarios, a device is provided. The device comprises an analog main signal path and a digital control circuit. The analog main signal path is configured to amplify and output an analog sensor signal of a sensor at a digitally-controllable output amplitude. The digital control circuit is coupled with the analog main signal path. The digital control circuit is configured to determine a digital control signal. The digital control circuit is further configured to provide the digital control signal to the analog main signal path to reduce a gain error of the analog main signal path. The analog main signal path is configured to set the digitally-controllable output amplitude depending on the digital control signal.

The analog main signal path may be all-analog, i.e., exclude any digital processing of the analog sensor signal, e.g., for forwarding, amplifying, and outputting the analog sensor signal. The analog main signal path may be digitally assisted by the digital control circuit (split architecture). The digital control circuit may perform control functionality with respect to the analog main signal path. The digital control circuit, in particular, may control the digitally-controllable output amplitude via the digital control signal. E.g., the digital control signal may digitally encode a set output amplitude. E.g., the digital control signal may be a sequence of ZEROs and ONEs.

By providing the split architecture, long delays for outputting the sensor signal may be avoided. This is because the analog sensor signal is processed in the analog domain. E.g., delays may be in the sub-millisecond regime. E.g., the analog main signal path may output the analog sensor signal at a bandwidth of more than 1 kHz, preferably of more than 100 kHz, more preferably of more than 300 kHz. Still, a high accuracy in the forwarding, outputting, and amplifying the analog sensor signal may be achieved by the split architecture employing the digital control circuit digitally assisting the analog main signal path.

Various scenarios are conceivable to implement the digitally-controllable output amplitude. In some scenarios, said amplifying of the analog sensor signal may implement a digitally-controllable gain; then, the output amplitude may be set by adjusting the digitally-controllable gain depending on the digital control signal. Alternatively or additionally, in some scenarios the sensor may provide the analog sensor signal with a digitally-controllable amplitude; then, the output amplitude may be set by adjusting the digitally-controllable amplitude with which the sensor provides the analog sensor signal depending on the digital control signal. Thus, in the various scenarios, depending on the particular architecture of the analog main signal path, various techniques of setting the digitally-controllable output amplitude may be available.

FIG. 1 illustrates aspects of a device 100 comprising a sensor 111. The sensor 111 and an amplifier 112 form the analog main signal path 102 along which an analog sensor signal 195 provided by the sensor 111 is forwarded, amplified, and eventually output via a terminal 113. The analog sensor signal 195 is output via the terminal 113 at a certain amplitude 199 (output amplitude). The output amplitude 199 may be higher or smaller than the amplitude 198 with which the sensor 111 provides the analogue sensor signal 195 (input amplitude); the relationship between the output amplitude 199 and the input amplitude 198 is described by an overall gain of the analog main signal path 102.

The output amplitude 199 is digitally-controllable. The analog main signal path 102, in this regard, receives the digital control signal 190 from a digital control circuit 101. Depending on the digital control signal 190, the output amplitude 199 is controlled.

The digital control circuit 101 is configured to determine the digital control signal 190 to reduce a gain error of the analog main signal path 102. E.g., the gain error may be introduced due to varying environmental conditions such as temperature and mechanical stress applied to the device 100, and the sensor 111 in particular. E.g., the mechanical stress may be induced by moisture or humidity. Over the lifetime of the device 100, thereby, different output amplitudes 199 can result depending on such and other environmental conditions. For a fixed set of operational parameters of the analog main signal path 102, a time dependency of the output amplitude 199 may be observed (drift).

E.g., the device 100 may be employed in a portable device to read out the sensor 111. In other scenarios, the device 100 may be employed in automotive applications. In some scenarios, the sensor 111 may be used for measuring the rotation of a toothed magnetic wheel which is part of a camshaft sensor.

E.g., the sensor 111 may be magnetic field sensor configured to sense a magnetic field and may operate according to the spinning Hall principle: The sensor 111 may include a Hall plate having four terminals. An excitation or bias current for the Hall plate is impressed into two opposite terminals. At the other two opposite terminals, the Hall voltage is picked up. The Hall plate may be operated in accordance with the spinning Hall principle. According to this principle, the connections of the Hall plate are cyclically exchanged at a clock rate of the bias current, i.e. the excitation current is impressed at a first pair of terminals during one clock period and at a second pair of terminals, arranged at an angle of about 90° with respect to the first pair of terminals, in a subsequent clock period. The connections for picking up the Hall voltage are correspondingly exchanged. Offset errors in the analog sensor signal output by the Hall plate can be reduced by adding the Hall voltages picked up in successive clock periods. However, there may be remaining offset errors and techniques of reducing such remaining offset errors are disclosed herein.

Various kinds and types of sensors 111 may be employed. E.g., for magnetic field sensors, operation according to the Giant Magnetoresistive Effect (GMR), Tunnel Magnetoresistive Effect (TMR), Anisotropic Magnetoresistive Effect (AMR) may be employed. In the various scenarios disclosed herein, other physical quantities than the magnetic field may be measured, e.g., acceleration, electrical field, pressure, etc.

Some of the sensors 111 employed for the various disclosed scenarios may be differential sensors. An example is the magnetic field sensor operating according to the spinning Hall principle. A transconductance amplifier may be provided (not shown in FIG. 1). The transconductance amplifier may convert the differential voltage signal provided by the differential sensor into a current.

Figure 2:
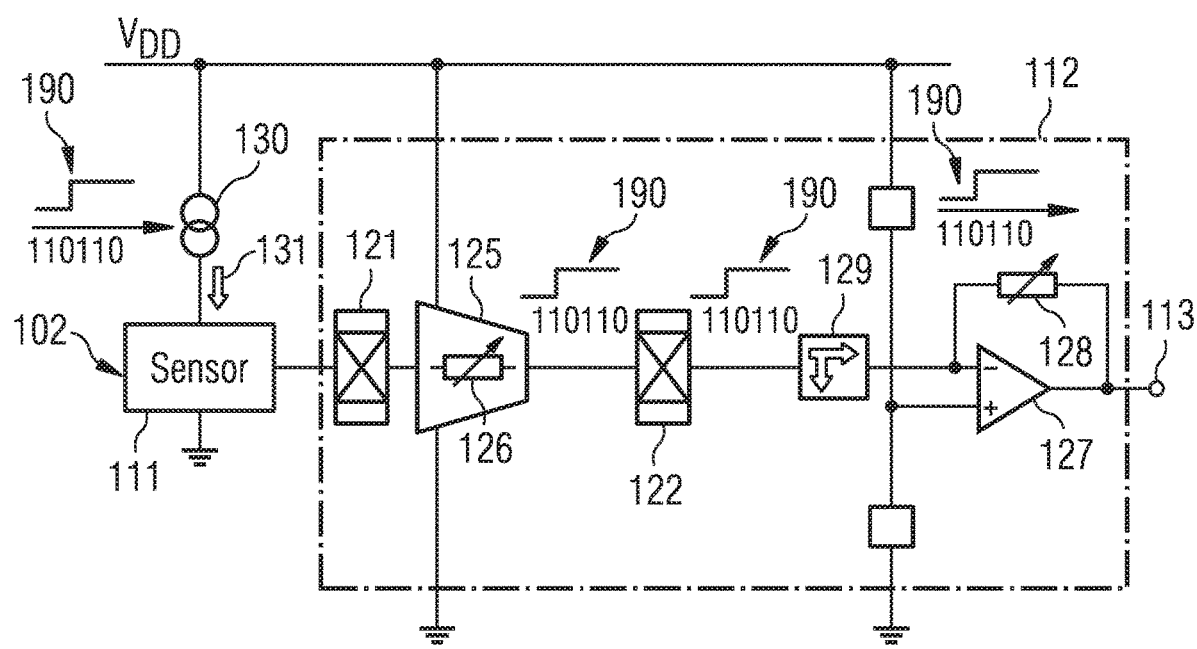
FIG. 2 schematically illustrates the device of FIG. 1 at a greater level of detail, wherein the devices comprises chopping switches arranged in the analog main signal path to reduce an offset error.

FIG. 2 illustrates the device 100 of FIG. 1 at greater detail. As can be seen from FIG. 2, a current source 130 is provided in the analog main signal path 102. The current source 130 generates a bias current 131 and provides the bias current 131 to the sensor 111. The current source 130, in the example of FIG. 2, is coupled with a supply voltage VDD. In some scenarios, the bias current 131 is modulated at a respective clock rate.

While in the scenario of FIG. 2 a current source 130 is illustrated, in the various scenarios disclosed herein it is possible to include a voltage source in the analog main signal path configured to generate a bias voltage and provide the bias voltage to the sensor 111. The voltage source may be coupled with the supply voltage VDD. In some scenarios, the bias voltage may be modulated at a respective clock rate.

In the scenario FIG. 2, the amplifier 112 is driven by the supply voltage VDD as well. The amplifier 112 comprises an input stage and an output stage. In the scenario of FIG. 2, the input stage formed by a first amplifier 125, e.g., in the scenario FIG. 2 a transconductance amplifier 125. Further, in the scenario FIG. 2, the output stage is formed by a second amplifier 127, e.g., in the scenario FIG. 2 implemented by an operational amplifier 127. In some scenarios, the amplifier 112 may comprise further stages or a smaller number of stages.

The specific architecture of the amplifier 112 is not germane to the functioning of the various techniques disclosed herein. E.g., in some scenarios, a differential amplifier such as a programmable gain instrumentation amplifier may be employed. E.g., the instrumentation amplifier may have a comparably high input impedance. Here, the DC offset caused by the instrumentation amplifier may be inherently small, but may be nonetheless further reduced by techniques disclosed herein.

The amplifier 112, in the scenario of FIG. 2, is a digitally-controllable programmable gain amplifier; i.e., the amplifier 112 can adjust the gain associated with the amplifying depending on the digital control signal 190. Hence, the gain is digitally-controllable. By adjusting the gain, the output amplitude 199 can be set. E.g., the amplifier 112 may be integrated into a package. The package may comprise a terminal or pin for receiving the digital control signal 190.

In the scenario FIG. 2, for illustrative purposes, the amplifier 112 is configured to adjust, both, contributions to the overall gain by the input stage, i.e., the transconductance amplifier 125, as well as by the output stage, i.e., the operational amplifier 127. In other scenarios, the amplifier 112 may be configured to adjust either contributions to the overall gain by the input stage or by the output stage.

In detail, the transconductance amplifier 125 has a digitally-controllable sense resistor 126. The sense resistor 126 may be for source degeneration. The sense resistor 126 is configured to receive the digital control signal 190 and adjust its resistivity depending on the digital control signal 190. Thereby, the gain contribution by the input stage is adjusted. Thus, the digitally-controllable output amplitude 199 is set.

Further, the operational amplifier 127 has a feedback branch comprising a digitally-controllable feedback resistor 128. The digitally-controllable feedback resistor 128 is configured to receive the digital control signal 190 and adjust its resistivity depending on the digital control signal 190. Thereby, the gain contribution by the output stage is adjusted. Thus, the digitally-controllable output amplitude 199 is set.

A further option to set the digitally-controllable output amplitude 199—alternatively or additionally to said adjusting the gain of the amplifier 112—is to control the bias current 131 provided by the current source 130. E.g., the current source 130 may be configured to receive the digital control signal 190 and adjust the bias current 131 depending on the digital control circuit 190. Typically, a larger (smaller) amplitude of the bias current 131 results in a larger (smaller) input amplitude 198 of the analog sensor signal 195. In some scenarios, it is possible to control the bias voltage provided by a respective programmable voltage source.

A still further option to set the digitally-controllable output amplitude 199—alternatively or additionally to said adjusting the gain of the amplifier 112 and said controlling of the bias current 131—is to provide a digitally-controllable current divider 129. The digitally-controllable current divider 129 may be arranged at various positions along the main signal path 102. For illustrative purposes, in the scenario illustrated in FIG. 2, the current divider 129 is arranged upstream of the amplifier 127. The current divider 129 may be configured to pass through only a fraction of the received input current along the analog main signal path 102; the remaining fraction may be split off and, e.g., fed to ground. To set the pass-through fraction of the received input current, the current divider 129 may comprise one or more digitally-controllable switches, such as switches based on a metal oxide field effect transistor (MOSFET), etc. (not shown in FIG. 2). Here, the digital control signal 190 may be fed to the digitally-controllable switches.

The structure and architecture of the current divider 129 is not germane for setting the digitally-controllable output amplitude 199. E.g., an example current divider 129 is known from K. Bult and G. J. G. M. Geelen, An inherently linear and compact MOST-only current division technique, in IEEE J. of Solid-State Circuits 27 (1992) 1730-1735, FIG. 4.

By means of the digital control signal 190 it is thus possible to set the digitally-controllable output amplitude 199. In particular, setting of the digitally-controllable output amplitude 199 via the digital control signal 190 may occur in a multiplicative manner. By appropriately determining the digital control signal 190, it thereby becomes possible to reduce the gain error of the analog main signal path 102.

Hereinafter, various techniques are disclosed with respect to reducing the offset error. To reduce the offset error of the analog main signal path 102, chopping switches 121, 122 are provided upstream and downstream of the input stage of the amplifier 112. In other scenarios, a larger or smaller number of chopping switches 121, 122 may be provided. The chopping switches 121, 122 are optional.

Figure 3:
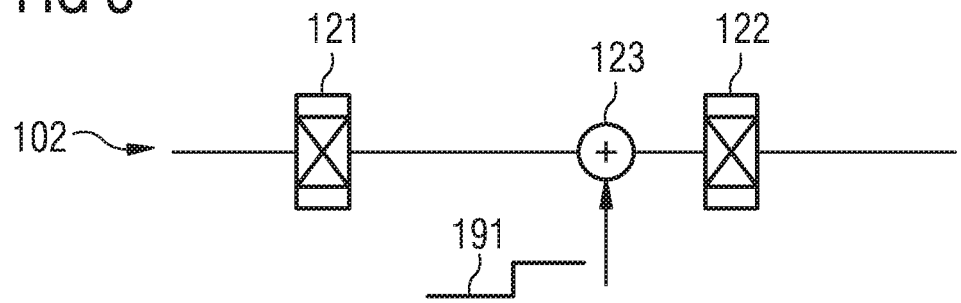
FIG. 3 schematically illustrates the chopping switches arranged in the analog main signal path and further illustrates adding of a further control signal to further reduce the offset error by compensating a chopper ripple according to various embodiments.

FIG. 3 illustrates aspects of the plurality of chopping switches 121, 122. The chopping switch 121 is arranged upstream in the analog main signal path 102 of the chopping switch 122. It is possible that at least parts of the amplifier 112 are arranged in-between the chopping switches 121, 122, e.g., the input stage of the amplifier 112. The sensor 111 may provide the analog sensor signal 195 with a first (residual) DC offset. A second DC offset may be added to the analog sensor signal by the amplifier 112. The chopping switches 121, 122 reduce the overall DC offset and thereby reduce the offset error.

E.g., the chopping switches 121, 122 may be driven by a chopper clock signal. The chopper clock signal may be a square waveform. The chopping switch 121 acts as an analog modulator. The chopping switch 121 is configured to chop the received analog sensor signal at a first frequency f1 to generate a signal having an AC amplitude that varies at the given frequency f1, potentially with a DC offset. E.g., f1 may be in the range of 100 Hz-100 kHz, preferably in the range of 0.5 kHz-50 kHz. f1 corresponds to the chopper clock signal. The chopping switch 121 acts as an analog demodulator. The chopping switch 122 is configured to chop the received analog sensor signal at the given frequency f1 to generate a signal having a DC amplitude.

E.g., f1 may correspond to the clock rate of the bias current 131. In particular, by modulating the bias current 131 with the given frequency f1, a reduction of the first DC offset generated by the sensor 111 may be achieved. Further, because the second DC offset of the amplifying may be introduced in-between the first and second chopping switches 121, 122, after the demodulation of the signal by the second chopping switch 122, the second DC offset may be reduced. Hence, by reducing the first and second DC offsets, the offset error is reduced.

By reducing the offset error directly in the analog main signal path 102, if compared to reference implementations relying on a digital lookup table of offsets versus temperature, a more reliable and accurate reduction may be achieved. Multi-temperature measurements for calibration are not required. Long term drifts resulting in a systematic error if compared to the stored values in the digital look up table are avoided. Thus, according to the techniques disclosed herein, the offset error may be reduced by a factor of approximately up to 100—which is higher than the reduction factor of approximately 3-10 for reference implementations relying on the digital lookup table. E.g., the DC offset may be limited to less than 1 Microvolts. A comparably fast offset error reduction may be achieved. Aliasing effects may be low. The chopping may be continuous in time such that an accurate offset reduction may be achieved.

However, the signal generated by the chopping switch 122 may have an overlaid chopper ripple error. The chopper ripple error corresponds to remainders of the DC offset of the analog sensor signal now transformed and modulated into the AC domain by the second chopping switch 122. Hence, in some scenarios it may be desirable to further reduce the offset error of the analog main signal path 102 by reducing the chopper ripple.

In some scenarios, a low-pass filter may be employed arranged downstream of the second chopping switch 122 (not shown in FIG. 3). The low-pass filter may filter out the chopping ripple in the AC domain.

In further scenarios, an analog feedback circuit including an analog low-pass filter/integrator may be employed to further reduce the offset error by reducing the chopper ripple.

In still further scenarios, the digital control circuit 111 can be employed to further reduce the offset error by reducing the chopper ripple. Here, a low-pass filter may be implemented by the digital control circuit 111. By implementing the integration/low-pass filter in the digital domain, favorable electromagnetic compatibility (EMC) features can be achieved. Further, low-pass filtering in the digital domain may be possible at a comparably high accuracy—in particular, if compared to reference implementations which implement a low-pass filter in the analog domain. Further, in scenarios where a low-pass filter is situated in the analog main signal path 102, a significant delay may be introduced, thereby limiting the operational bandwidth of the analog main signal path 102.

Figure 4:
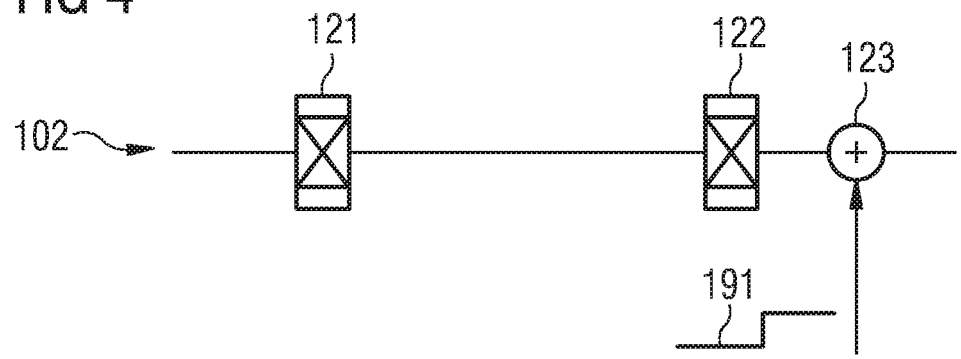
FIG. 4 schematically illustrates the chopping switches arranged in the analog main signal path and further illustrates adding of a further control signal to further reduce the offset error by compensating a chopper ripple according to various embodiments.

For this, the digital control circuit 111 may be configured to determine and provide a further control signal 191 to the analog main signal path 102 which counteracts the chopper ripple. It is possible that the further control signal is added by means of an adder 123 to the analog main signal path 102. Said adding may occur in between the chopping switches 121, 122 as illustrated in the scenario of FIG. 3; in such a scenario, the further control signal 191 corresponds to a DC signal. In further scenarios, as illustrated in the scenario of FIG. 4, said adding may occur downstream of the second chopping switch 122; in such a scenario, the further control signal 191 corresponds to an AC signal. Depending on the particular implementation of the adder 123, the further control signal 191 may be a digital signal or in analog signal.

Figure 5:
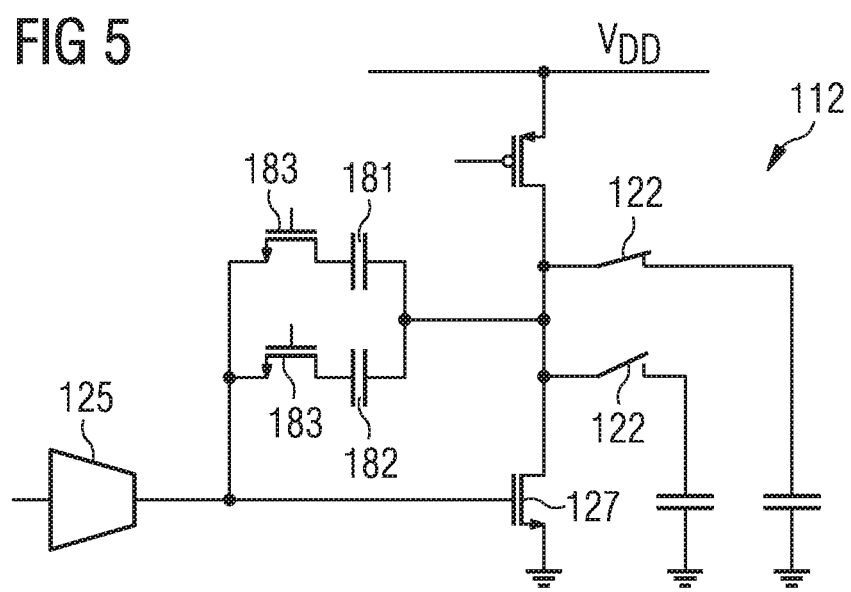
FIG. 5 schematically illustrates the amplifier of the analog main signal path at greater detail according to various embodiments, wherein the amplifier comprises a pair of compensation capacitors.

FIG. 5 illustrates aspects of compensation capacitors 181, 182. The compensation capacitors 181, 182 are sometimes referred to as Miller capacitors. By means of the compensation capacitors 181, 182, a so-called chopped Miller compensation may be achieved. In the scenario of FIG. 5, the compensation capacitors 181, 182 are arranged in parallel with a push-pull amplifier 127 forming the output stage of the amplifier 112. Each one of the compensation capacitors 181, 182 is associated with a given chopping polarity of the chopped analog sensor signal 195. Hence, the compensation capacitors 181, 182 are provided in duplicate so that, when a chopped input signal is supplied, the first capacitor 181 is active during a first clock phase and the second capacitor is active during a second clock phase. Activation of the capacitors 181, 182 is achieved via the switches 183.

Such a configuration avoids the need for cyclic charge reversal in a single compensation capacitor where the chopped signal is present. In detail, after a few clock cycles of the chopper clock signal, both, the first compensation capacitor 181 and the second compensation capacitor 182 are charged and in further clock cycles only small voltage differences are induced that have smaller amplitudes and are slower as compared with the voltage differences caused by the chopper frequency. The amplifier 112, therefore, allows continuous-time signal processing, in contrast to switched capacitor filters operating based upon the sample-and-hold principle.

By such techniques it becomes possible to achieve high gains by the amplifier 112 at a comparably high chopper frequency. A high bandwidth of the analog main signal path 102 may be achieved. The delay for outputting the analog sensor signal 195 may be low. The amplifier 112 may exhibit comparably small power loss and have comparably good noise properties. The chip are required for the amplifier 112 may be moderate. The overall current consumption may be reduced.

Figure 6A:
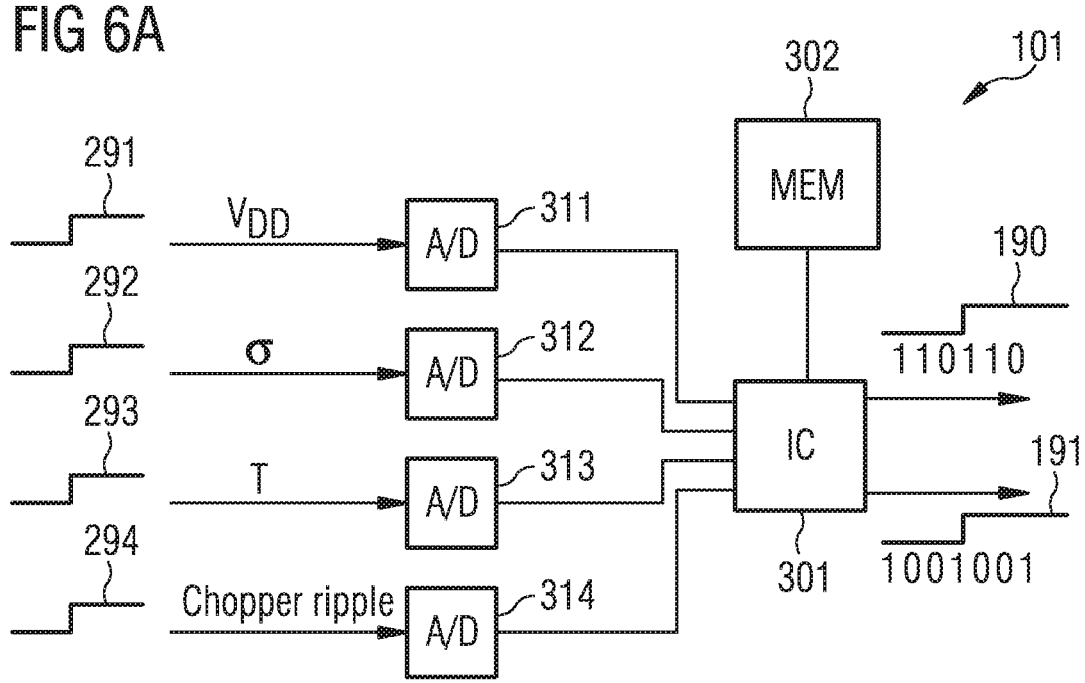
FIG. 6A schematically illustrates the digital control circuit according to various embodiments, wherein the digital control circuit comprises a plurality of analog-to-digital converters configured to convert a plurality of input signals to obtain digital representations of each one of the plurality of input signals.

FIG. 6A illustrates aspects of the digital control circuit 101. The digital control circuit 111, as illustrated in the scenario of FIG. 6 A, comprises one analog-to-digital converter (ADC) 311-314 per input terminal. Via the various input terminals, input signals 291-294 are received. In the scenario of FIG. 6A, four input signals 291-294 are received. However, in various other scenarios, a smaller or larger number of input signals may be received. The ADCs 311-314 are configured to convert the input signals 291-294 to obtain digital representations of each one of the input signals 291-294. A processor 301 is coupled with a memory 302 is and is configured to determine the digital control signal 190 and optionally the further control signal 191 depending on the input signals 291-294, respectively the digital representations of each one of the input signals 291-294. E.g., the memory 302 may be a non-volatile memory such as an electrically erasable programmable read-only memory (EEPROM) or flash memory.

In the scenario of FIG. 6A, a first input signal 291 is indicative of the supply voltage VDD. A second input signal 292 is indicative of a mechanical stress applied to the sensor 111. A third input signal 293 is indicative of the temperature of the sensor 111. A fourth input signal 294 is indicative of the chopper ripple of the chopping switches 121, 122. Depending on where the analog main signal path 102 is tapped, the fourth input signal 294 may be a DC or AC signal.

E.g., the first input signal 291 may be received by tapping the supply voltage VDD line. E.g., the second input signal 292 may be received from a mechanical stress sensor. E.g., the third input signal 293 may be received from a temperature sensor. E.g., the fourth input signal 294 may be received by tapping the analog main signal path 102, e.g., in between the chopping switches 121, 122 or downstream of the chopping switches 121, 122.

Figure 6B:
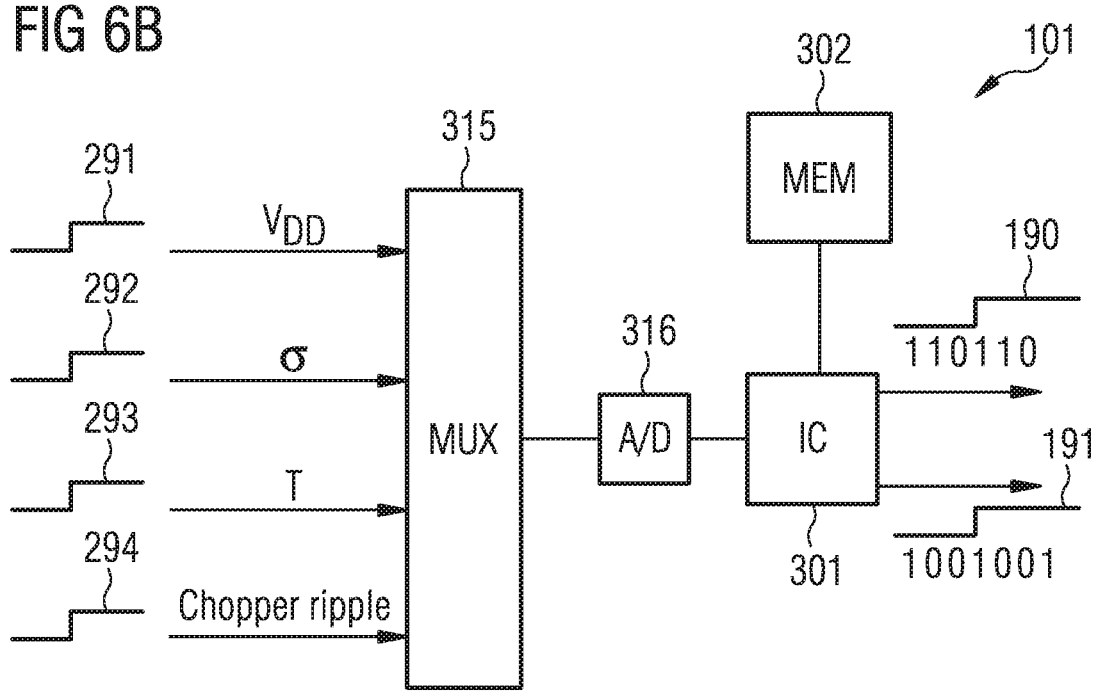
FIG. 6B schematically illustrates the digital control circuit according to various embodiments, wherein the digital control circuit comprises a time-division multiplexed analog-to-digital converter comprising a plurality of analog inputs and configured to convert a plurality of input signals received via the plurality of analog inputs to obtain the digital representations of each one of the plurality of input signals.

The scenario of FIG. 6B generally corresponds to the scenario of FIG. 6A. However, instead of four ADCs 311-314, i.e., a single ADC 311-314 per input signal 291-294, in the scenario of FIG. 6B a multiplexer 315 in combination with a single ADC 316 is employed; i.e., a time-division multiplex ADC 315, 316 is configured to convert the plurality of input signals 291-294 received via the plurality of analog inputs to obtain the digital representations of each one of the plurality of input signals 291-294. The multiplexer 315 may be configured to switch between the various analog inputs at the given sampling rate for receiving one respective input signal 291-294 at a time.

The time-division multiplexed ADC 315, 316 allows reducing the space required on-chip for the analog-to-digital conversion; further, costs can be reduced. On the other hand, a latency introduced by the analog-to-digital conversion may be comparably larger. However, because typically the characteristics of the input signals 291-294 vary comparably slowly in time, a limited sampling rate of the one or more ADCs 311-316 may be tolerable. E.g., the one or more ADCs 311-316 may have a sampling rate that is smaller than 50 kHz, preferably smaller than 1 kHz, more preferably smaller than 500 Hz.

I.e., as can be seen, the sampling rate of the one or more ADCs 311-316 may be considerably smaller than the bandwidth of the analog main signal path 102. The potentially slow sampling rate of the one or more ADCs 311-316 may not increase the delay with which the analog sensor signal 195 is forwarded, amplified, and output by the analog pain signal path 102. This becomes possible by the split architecture employing the digital control circuit 101 and the analog main signal path 102.

Optionally, in the various disclosed scenarios, the digital control circuit 101 may comprise a digital filter configured to reduce noise due to the analog-to-digital conversion by the at least one ADC 311-316 (not shown in FIGS. 6A and 6B).

The processor 301 may implement different functionality in order to determine the digital control signal 190 and/or the further control signal 191. The digital control signal 190 may be employed to reduce the gain error of the analog main signal path 102; while the further control signal 191 may be employed to reduce the offset error of the analog main signal path 102 by reducing the chopper ripple.

While in the scenario of FIGS. 6A and 6B as single processor 301 is illustrated, in other scenarios multiple processors may be employed. E.g., it may be possible to have a dedicated processor for determining the digital control signal 190 and a further dedicated processor for determining the further control signal 191. In particular, it may be possible to have at least two distinct digital control circuits, wherein a first one of the digital control circuits is configured to determine the digital control signal 190 and a second one of the digital control circuits is configured to determine the further control signal 191. Hence, it may be possible to use distinct ADCs and/or processors for determining the digital control signal 190 and the further control signal 191, respectively.

First, aspects with respect to the determining of the further control signal 191 are discussed. The processor 301 is configured to determine the further control signal 191 depending on the fourth input signal 294 indicative of the chopper ripple. Via the input signal 294 and the further control signal 191, a feedback branch for reducing the offset error, in particular for reducing the chopper ripple may be implemented. It is possible that the processor 301 is configured to integrate the fourth input signal 294 indicative of the chopper ripple, i.e., to low-pass filter the fourth input signal 294. This is done to filter out other contributions than the chopper ripple. Then, the processor 301 can determine the further control signal 191 based on the low-pass filter input signal 294. E.g., referring to the scenario of FIG. 3, the processor 301 can transform the filtered fourth input signal 294 to DC and invert the sign thereof to obtain the further control signal 191 to be added in between the chopping switches 121, 122. E.g., referring to the scenario of FIG. 4, the processor 301 can phase-shift the filtered fourth input signal 294 by 180 degrees to obtain the further control signal 191 to be added downstream of the chopping switches 121, 122.

Figure 7:
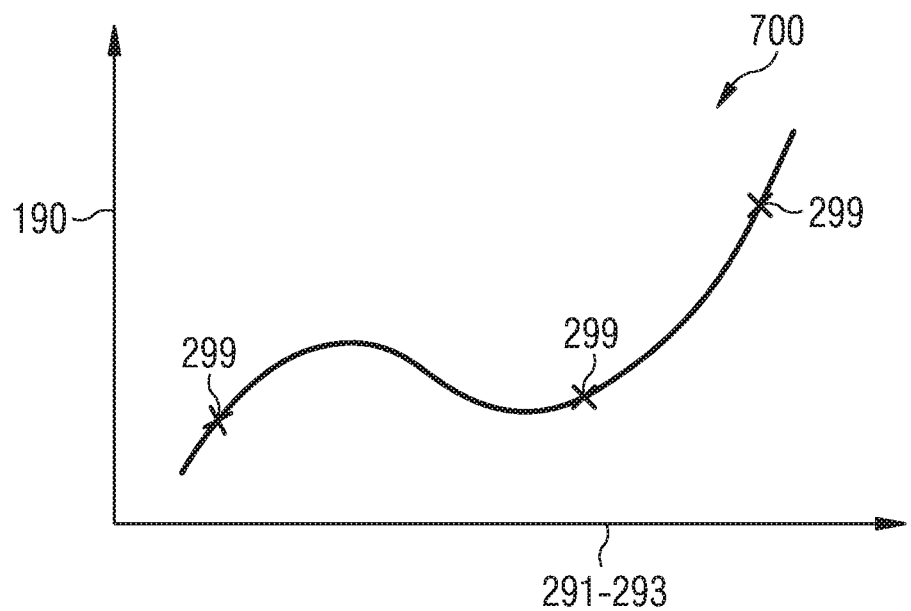
FIG. 7 schematically illustrates a polynomial dependency between the input signals and the digital control signal used to determine the digital control signal by a processor of the digital control circuit.

Now referring to FIG. 7, aspects with respect to determining the digital control signal 190 are discussed. The processor 301 is configured to determine the digital control signal 190 depending on the control signals 291-293 indicative of the supply voltage VDD, the mechanical stress, and the temperature. In other scenarios, the processor 301 may be configured to determine the digital control signal 190 depending on a single one or any combination of the control signals 291-293, e.g., depending on only the supply voltage VDD, only the temperature, or only the mechanical stress.

In detail, the processor 301 is configured to determine the digital control signal 190 depending on a predefined polynomial dependency 700 between one or more of the input signals 291-294 and the digital control signal 190. E.g., the predefined polynomial dependency may be of a predefined order, e.g., of first order, second order, third order, or fourth order, etc. Corresponding polynomial parameters defining the polynomial dependency may be stored in the memory 302.

E.g., by certain calibration points 299 it may be possible to determine the predefined polynomial dependency 700 during calibration. A simple two-point or three-point calibration may be possible, reducing efforts in preparing the device 100.

The predefined polynomial dependency 700 may be indicative of the gain error caused by certain values of the supply voltage VDD, the mechanical stress, and/or the temperature. The predefined polynomial dependency 700 may counteract or compensate the gain error. Generally speaking, the one or more input signals 291-293 may be indicative of at least one environmental condition of the device 100, e.g., in particular of the sensor 111. Then, the processor 301 may determine the digital control signal 190 based on the digital representation of each one of the one or more input signals 291-293 to reduce the gain error of the analog main signal path 102.

E.g., in a scenario where the first input signal 291 indicative of the supply voltage VDD is received by the digital control circuit 101, it becomes possible to determine the digital control signal 190 such that a ratiometric behavior of the analog main signal path 102 is achieved. The ratiometric behavior may correspond to a proportional dependency between the amplitude of the supply voltage VDD and the output amplitude 199 of the analog sensor signal 195. Deviations between the ideal proportional dependency of the ratiometric behavior may thus contribute to the gain error and may be reduced in various scenarios disclosed herein.

In some scenarios, the predefined polynomial dependency 700 may also take into account cross-sensitivities or interdependencies between the various input signals 291-294. Such interdependencies may arise from influences between the various environmental conditions indicated by the input signals 291-294 on the various sensors providing the input signals 291-294. Typically, cross-sensitivities may be in particular relevant for the second input signal 292 indicative of the mechanical stress and the third input signal 293 indicative of the temperature. E.g., it may be possible that a temperature sensor shows a dependency on mechanical stress/moisture; in such a scenario, where the mechanical stress sensor a indicates an increased level of mechanical stress, the cross-sensitivity may falsify the input signal 293 indicative of the temperature; by correspondingly designing of the polynomial dependency 700, it may be possible to reduce such interdependencies. Thereby, an accuracy of determining the digital control signal 190 and/or an accuracy of reduce a gain error of the analog main signal path 102 may be increased.

By implementing the determining of the digital control signal 190 by means of the polynomial dependency 700, a computationally inexpensive determining of the digital control signal 190 becomes possible. In particular if compared to reference implementations relying on a lookup table including a limited number of discrete values in combination with interpolation, a more efficient and accurate solution may be achieved. Further, it may not be required to store large amounts of data in the memory 302; data may be limited to a number of parameters defining the polynomial dependency 700. Thus, the size of the memory 302 may be comparably limited-in particular if compared to reference implementations relying on a lookup table. Thus, the complexity and system costs of the digital control circuit 101 may be reduced. It may be possible to implement the digital control circuit 101 highly area efficient. The digital control circuit 101 may be integrated in a small area on chip. The memory 302 may be designed smaller. Further, it may be easier to cancel the cross-sensitivities, in particular if compared to lookup table-based scenarios.

Figure 8:
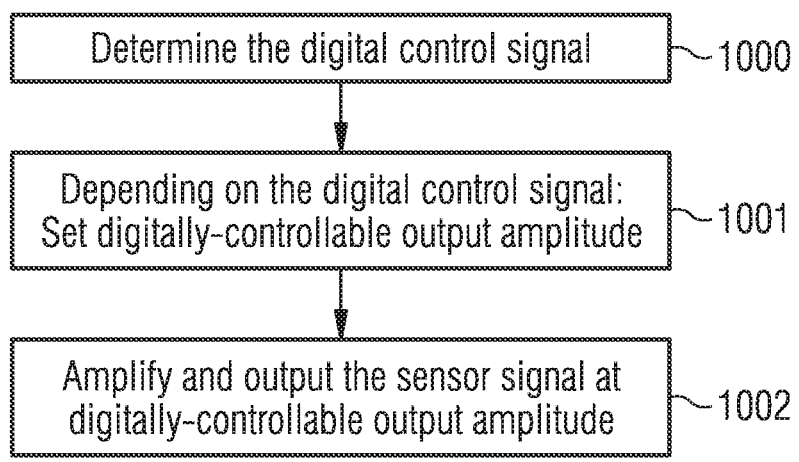
FIG. 8 is a flowchart of a method according to various embodiments.

FIG. 8 is a flowchart of a method according to various embodiments. First, at 1000, the digital control signal is determined. The digital control signal may be determined, e.g., depending on one or more input signals indicative of at least one environmental condition of a device or a sensor providing an analog sensor signal. E.g., for determining the digital control signal, a predefined polynomial dependency may be used.

The digital control signal may be determined in order to reduce a gain error of the analog main signal path. Alternatively or additionally, the digital control signal may be determined in order to implement a ratiometric behavior of the output amplitude of the analog sensor signal. The gain error may comprise a deviation from the ratiometric behavior.

Next, at 1001, a digitally-controllable output amplitude is set depending on the digital control signal.

Next, at 1002, the sensor signal is amplified and output at the digitally-controllable output amplitude.

By setting the output amplitude based on the digital control signal, that the gain error is reduced, e.g., by implementing a ratiometric behavior.

Optionally, the method may further comprise determining a further control signal and setting the digitally-controllable output signal at 1001 further depending on the further control signal (not shown in FIG. 8). The further control signal may be determined based on an input signal indicative of a chopper ripple of chopping switches in the analog main signal path. The further control signal may be determined to reduce an offset error of the analog main signal path.

Summarizing, above techniques of implementing a digitally-assisted, fast forwarding analog main signal path for outputting and amplifying an analog sensor signal have been illustrated. These techniques employ a digital control signal to reduce a gain error, e.g., by implementing a ratiometric behavior. If compared to reference implementations relying on an analog control signal to reduce gain errors, additional circuitry such as DACs can be avoided and the introduction of additional analog errors may be avoided. Employing analog multipliers is avoided. Thus a higher accuracy can be achieved. A high bandwidth can be achieved.

Although the invention has been shown and described with respect to certain preferred embodiments, equivalents and modifications will occur to others skilled in the art upon the reading and understanding of the specification. The present invention includes all such equivalents and modifications and is limited only by the scope of the appended claims.

For example, although the disclosed digital control circuit and the main signal path are described in relation to a sensor, they are not limited to applications in conjunction with a sensor. Rather, the disclosed digital control circuit and the main signal path can be employed in any system wherein signals are to be processed with a low offset error and low gain error.

What is claimed is:

1. A device, comprising:
an analog main signal path comprising a digitally-controllable programmable gain amplifier configured to receive and amplify an analog sensor signal of a sensor, and further configured to output an amplified output analog sensor signal, thereby defining an analog main signal path gain, and
a digital control circuit coupled to the digitally-controllable programmable gain amplifier, the digital control circuit configured to determine a digital control signal and to provide the digital control signal to the digitally-controllable programmable gain amplifier to adjust a gain of the digitally-controllable programmable gain amplifier to reduce a gain error of the analog main signal path gain,
wherein the digitally-controllable programmable gain amplifier is configured to modify the analog main signal path gain based on the digital control signal, thereby making the analog main signal path gain digitally controllable,
wherein the digital control circuit is configured to receive a temperature signal from a temperature sensor that indicates a temperature sensed at the sensor, a mechanical stress signal from a mechanical stress sensor that indicates a mechanical stress applied to the sensor, and a supply voltage signal that indicates a supply voltage of the sensor,
wherein the digital control circuit is configured to determine the digital control signal based on the temperature signal, the mechanical stress signal, and the supply voltage signal,
wherein the digitally-controllable programmable gain amplifier comprises an input stage formed by a first amplifier, an output stage formed by a second amplifier, and a digitally controllable current divider coupled to an output of the first amplifier and an input of the second amplifier and configured to pass through only a fraction of input current received from the output of the first amplifier and feed a remainder of the input current to ground,
wherein the first amplifier is configured to receive the digital control signal, amplify the analog sensor signal based on the digital control signal, and output the amplified analog sensor signal to the digitally-controllable current divider, and wherein the second amplifier is configured to receive the digital control signal, amplify a current divider signal from the digitally controllable current divider based on the digital control signal, and output the amplified output analog sensor signal.

2. The device of claim 1,
wherein the first amplifier comprises a transconductance amplifier having a digitally-controllable sense resistor,
wherein the digitally-controllable sense resistor is configured to receive the digital control signal and adjust its resistivity depending on the digital control signal to amplify the analog sensor signal.

3. The device of claim 2,
wherein the second amplifier comprises an operational amplifier having a digitally-controllable feedback resistor,
wherein the digitally-controllable feedback resistor is configured to receive the digital control signal and adjust its resistivity depending on the digital control signal to amplify the amplified analog sensor signal.

4. The device of claim 1,
wherein the analog main signal path comprises the sensor and an electrical energy source of the sensor, the electrical energy source being configured to provide at least one of a bias current or a bias voltage to the sensor,
wherein the electrical energy source is configured to receive the digital control signal and adjust the at least one of the bias current or bias voltage depending on the digital control signal to adjust the amplified output analog sensor signal.

5. The device of claim 1,
wherein the digital control circuit comprises at least one analog-to-digital converter configured to convert the temperature signal, the mechanical stress signal, and the supply voltage signal to obtain a digital representation of each one.

6. The device of claim 5,
wherein the at least one analog-to-digital converter comprises a time-division multiplexed analog-to-digital converter.

7. The device of claim 5,
wherein the at least one analog-to-digital converter has a sampling rate that is smaller than 50 kHz.

8. The device of claim 1,
wherein the analog main signal path comprises a plurality of chopper switches arranged at different locations on the analog main signal path, the plurality of chopper switches including a first chopper switch coupled between an output of the sensor and an input of the first amplifier and a second chopper switch coupled between an output of the first amplifier and an input of the digitally controllable current divider;
wherein the plurality of chopper switches is configured to chop the analog sensor signal at a predefined frequency to reduce an offset error of the analog main signal path.

9. The device of claim 8,
wherein the digital control circuit is configured to receive an input signal indicative of a chopper ripple caused by the plurality of chopper switches,
wherein the digital control circuit is configured to provide a further control signal to the analog main signal path to reduce the chopper ripple.

10. The device of claim 1, further comprising:

the sensor, wherein the sensor is a magnetic sensor configured to sense a magnetic field based on a spinning Hall principle.

11. A method, comprising:

receiving a temperature signal from a temperature sensor that indicates a temperature sensed at a sensor, a mechanical stress signal from a mechanical stress sensor that indicates a mechanical stress applied to the sensor, and a supply voltage signal that indicates a supply voltage of the sensor, determining a digital control signal based on the temperature signal, the mechanical stress signal, and the supply voltage signal, setting a gain of a digitally-controllable programmable gain amplifier along an analog main signal path, wherein the digitally-controllable programmable gain amplifier is configured to receive an analog sensor signal from the sensor, and wherein the gain is set based on the digital control signal to reduce a gain error associated with the analog main signal path, and amplifying and outputting an output analog sensor signal at an output of the analog main signal path based on the gain, wherein setting the gain of the digitally-controllable programmable gain amplifier comprises setting a first gain of a first amplifier of the digitally-controllable programmable gain amplifier based on the digital control signal and setting a second gain of a second amplifier of the digitally-controllable programmable gain amplifier based on the digital control signal, the digitally-controllable programmable gain amplifier further comprising a digitally controllable current divider, wherein amplifying and outputting the analog sensor signal at an output of the analog main signal path based on the gain comprises providing the analog sensor signal from the sensor to the first amplifier, amplifying the analog sensor signal at the first amplifier based on the first gain, providing an amplified analog sensor signal from the first amplifier to the digitally controllable current divider, adjusting a current of the amplified analog sensor signal at the digitally controllable current divider based on the digital control signal, providing a current divided signal from the digitally controllable current divider to the second amplifier, amplifying the current divided signal at the second amplifier based on the second gain, and providing the output analog sensor signal at the output of the analog main signal path.

12. A device, comprising:

an amplifier configured to receive and amplify an analog sensor signal of a sensor, the amplifier comprising:

a first chopping switch having an input coupled to an output of the sensor, a transconductance amplifier having an input coupled to an output of the first chopping switch, the transconductance amplifier including a digitally-controllable sense resistor for adjusting a gain of the transconductance amplifier, a second chopping switch having an input coupled to an output of the transconductance amplifier, a digitally-controllable current divider having an input coupled to an output of the second chopping switch, and an operational amplifier having an input coupled to an output of the digitally-controllable current divider, the operational amplifier including a digitally-controllable feedback resistor for adjusting a gain of the operational amplifier, the digitally controllable feedback resistor having a first resistor terminal coupled to an output of the operational amplifier and having a second resistor terminal coupled to the input of the operational amplifier; and a digital control circuit coupled to the transconductance amplifier, the digitally-controllable current divider, and the operational amplifier, the digital control circuit configured to determine a digital control signal and to provide the digital control signal to the amplifier, wherein the digital control circuit is configured to receive a plurality of signals indicative of a respective plurality of environmental conditions in which the sensor resides, and wherein the digital control circuit is configured to determine the digital control signal based on the plurality of signals, wherein the transconductance amplifier is configured to receive the digital control signal, and adjust a gain of the analog sensor signal based on the digital control signal to produce a first gain adjusted analog sensor signal, and wherein the operational amplifier is configured to adjust a gain of the first gain adjusted analog sensor signal based on the digital control signal to produce a second gain adjusted analog sensor signal, and output the second gain adjusted analog sensor signal.

13. The device of claim 12, wherein the digitally-controllable sense resistor is configured to receive the digital control signal and to adjust its resistivity depending on the digital control signal to adjust the gain of the analog sensor signal.

14. The device of claim 13, wherein the digitally-controllable feedback resistor is configured to receive the digital control signal and to adjust its resistivity depending on the digital control signal to adjust the gain of the first gain adjusted analog sensor signal.

15. The device of claim 12, further comprising:

a current source coupled to the sensor, wherein the current source is configured to provide a bias current to the sensor, to receive the digital control signal, and to adjust the bias current provided to the sensor based on the digital control signal.

16. The device of claim 12, wherein the first chopping switch is configured to: receive the analog sensor signal from the sensor, chop the analog sensor signal based on a chopper signal, and output a first chopped sensor signal to the transconductance amplifier, wherein the second chopping switch is configured to: receive the first gain adjusted sensor signal from the transconductance amplifier, chop the first gain adjusted sensor signal based on the chopper signal, and output a second chopped sensor signal to the digitally-controllable current divider.

* * * * *